(12) United States Patent
Noll et al.

(10) Patent No.: US 6,683,552 B2
(45) Date of Patent: Jan. 27, 2004

(54) DUAL ANALOG-TO-DIGITAL CONVERTER SYSTEM FOR INCREASED DYNAMIC RANGE

(75) Inventors: John M. Noll, Sahalee, WA (US); Brian P. Bunch, Snohomish, WA (US); Sundara Murthy, Bellevue, WA (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 10/024,100

(22) Filed: Dec. 17, 2001

(65) Prior Publication Data

US 2003/0016150 A1 Jan. 23, 2003

Related U.S. Application Data

(60) Provisional application No. 60/306,195, filed on Jul. 17, 2001.

(51) Int. Cl.[7] .................................................. H03M 1/12
(52) U.S. Cl. ........................ 341/155; 341/139; 348/255
(58) Field of Search ................................. 341/139, 135, 341/131, 255; 342/92; 348/255; 600/364

(56) References Cited

U.S. PATENT DOCUMENTS

| | | | | |
|---|---|---|---|---|
| 4,525,741 A | * | 6/1985 | Chahal et al. ............... | 348/255 |
| 4,999,628 A | * | 3/1991 | Kakubo et al. .............. | 341/139 |
| 5,223,932 A | * | 6/1993 | Thomas et al. .............. | 348/571 |
| 5,482,036 A | * | 1/1996 | Diab et al. .................. | 600/364 |
| 5,801,657 A | * | 9/1998 | Fowler et al. ............... | 341/155 |
| 5,808,575 A | * | 9/1998 | Himeno et al. .............. | 341/139 |
| 5,825,318 A | * | 10/1998 | Patapoutian et al. ........ | 341/131 |
| 6,172,635 B1 | * | 1/2001 | Nakamura et al. .......... | 341/155 |
| 6,191,725 B1 | * | 2/2001 | Lavoie ........................ | 342/92 |
| 6,333,707 B1 | * | 12/2001 | Oberhammer et al. ...... | 341/155 |

FOREIGN PATENT DOCUMENTS

EP  0 701 745 B1 * 9/1999

OTHER PUBLICATIONS

Greger–Hansen et al., A Stacked A–To–D Converter for Increased Radar Signal Processor Dynamic Range, 2001 IEEE Radar Conference, May 2001, pp. 169–174.

* cited by examiner

Primary Examiner—Jean Bruner JeanGlaude
(74) Attorney, Agent, or Firm—Charles J. Rupnick

(57) ABSTRACT

A dual analog-to-digital (A/D) converter circuit having two separate channels coupled to receive a single analog input signal, each of the two channels includes a means for converting an analog input signal to a digital signal at respective sample times that are adjustable to be substantially simultaneous; a means for adjusting the gain of the two channels to differ by a predetermined factor; a means for detecting a channel overflow condition in one of the two channels having a higher gain; and a means for merging the two channels into a continuous output stream.

32 Claims, 1 Drawing Sheet

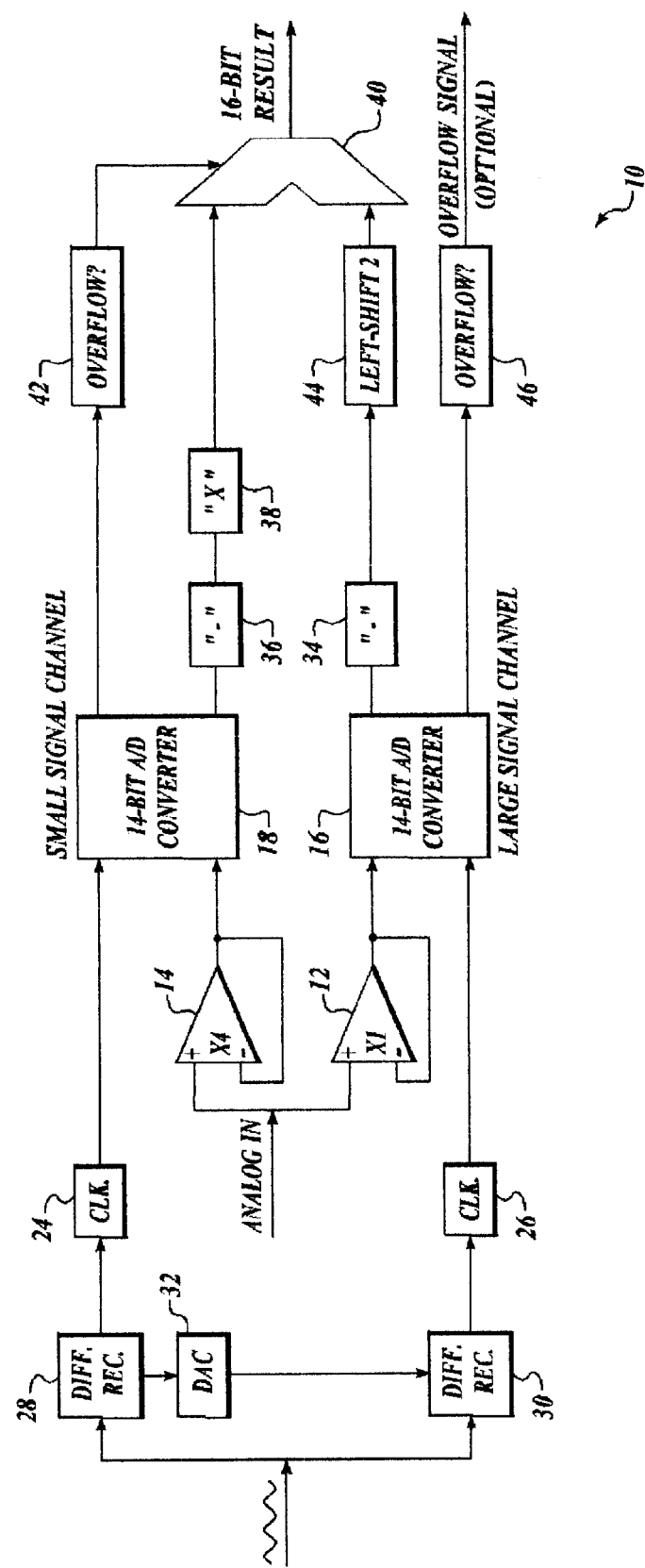

DUAL ANALOG-TO-DIGITAL CONVERTER SYSTEM FOR INCREASED DYNAMIC RANGE

This application claims the benefit of U.S. Provisional Application Serial No. 60/306,195, filed in the names of John M. Noll, Brian P. Bunch, and Sundara Murthy on Jul. 17, 2001, the complete disclosure of which is incorporated herein by reference.

FIELD OF THE INVENTION

The present invention relates to analog-to-digital signal conversion, and in particular to dual analog-to-digital converter circuits.

BACKGROUND OF THE INVENTION

Analog signals generated by various devices such as sensors are very often desired to be converted into corresponding digital signals because of the convenience and accuracy of digital signal processing. An analog-to-digital (A/D) converter is a well-known electronic circuit that receives an analog input signal and produces a digital output signal. Thus, the digital output signal is produced based on samples of the analog input signal taken over time. A/D converters are used to provide sequences of digital code representations of numbers in a chosen number base such that the numbers correspond to the amplitude value of sample portions of the analog signal input waveform with respect to a predetermined reference value.

In some circuits, it is desirable to maintain the peak input voltage of the analog signal at or near the maximum value for the range of input signals accepted by the A/D converter. Thus, the sampled analog input is typically normalized so that as much of the range of the converter is used as possible without overflowing. This normalization insures the quantization step-size is sufficiently small that sampling noise is minimized. The input signal normalization process, which is provided by a well-known Automatic Gain Control (AGC) circuit, requires both a variable gain mechanism to adjust the signal and knowledge of the gain value in downstream processing to compensate for the initial signal adjustment.

The AGC circuit typically monitors the analog input signal to the A/D converter and generates a feedback signal based on the monitored input signal. The feedback signal is provided to an amplifier to control the level of the analog input signal to the A/D converter. This feedback signal attempts to keep the peak voltage level of the analog input signal at or near the full-scale value of the input for the A/D converter.

Conventionally, the feedback signal is generated using analog circuitry. For example, such feedback loops typically include one or more of the following analog control blocks: a log amplifier, a summing amplifier, an integrator, and a differentiator. However, such feedback AGC loops are also known that utilize digital circuitry.

SUMMARY OF THE INVENTION

The present invention provides improved analog-to-digital (A/D) conversion by providing an apparatus dual channel analog-to-digital converter circuit and a method of performing dual channel analog-to-digital conversion, in contrast to the prior art devices and methods. The apparatus and method of the present invention extend the dynamic range of an A/D converter circuit and eliminates the need for an Automatic Gain Control circuit and its associated complexity.

According to one aspect of the invention, the apparatus and method of the invention are embodied as a novel dual A/D converter circuit that includes two separate channels coupled to receive a single analog input signal, each of the two channels having a means for converting an analog input signal to a digital signal at respective sample times that are adjustable to be substantially simultaneous; a means for adjusting the gain of the two channels to differ by a predetermined factor; a means for detecting a channel overflow condition in one of the two channels having a higher gain; and a means for merging the two channels into a continuous output stream.

According to another aspect of the invention, the dual A/D converter circuit of the invention includes a means for eliminating signal offset errors in the two channels. The means for eliminating signal offset errors is, for example, a digital subtraction circuit.

According to another aspect of the invention, the means for merging the two channels is operable as a function of a result generated by the channel overflow condition detecting means. Furthermore, the means for merging the two channels is operable to output a result of the channel having lower gain when a channel overflow condition is detected on the channel having higher gain.

According to another aspect of the invention, the means for adjusting the gain of the two channels further comprises an amplifier circuit in each of the two channels.

According to another aspect of the invention, the dual A/D converter circuit of the invention includes a means for matching a result of the channel having higher gain to a result of the channel having lower gain.

According to another aspect of the invention, the dual A/D converter circuit of the invention also includes a means for adjusting placement of a rising edge in a clock circuit portion of one channel in time with respect to a clock circuit portion of another channel so that the sample times of the two channels are substantially simultaneous.

According to another aspect of the invention, the channel overflow condition detecting means further comprises a digital comparator circuit.

According to still another aspect of the invention, the means for merging the two channels further comprises a means for adjusting a data bit position of a result of the channel having lower gain to match a result of the channel having higher gain.

According to yet other aspects of the invention, methods for converting an analog signal to a digital signal are provided. The methods of the invention include, for example, splitting an input analog signal into large and small signal channels; scaling the input signal on the large and small signal channels such that the small signal channel has a higher resolution than the large signal channel; sampling the large and small signal channels using separate analog-to-digital converters; and outputting a result of one of the large and small signal channels as a function of determining whether the small signal channel is valid.

The methods of the invention also include merging a result of the large signal channel with a result of the small signal channel into a merged result; and outputting the merged results.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawing, wherein:

the FIGURE is an illustration of the apparatus and method of the invention embodied as a novel dual analog-to-digital converter circuit.

DETAILED DESCRIPTION OF PREFERRED EMBODIMENT

The present invention is an apparatus and method for extending the dynamic range of an analog-to-digital (A/D) converter circuit that eliminates the need for an Automatic Gain Control (AGC) circuit and its associated complexity. Rather, the apparatus and method of the invention utilize two A/D converters that simultaneously sample on different channels two differently scaled versions of the same input signal. The scaling is such that one channel has a resolution that is four times higher the other channel. The higher resolution channel is monitored for data overflow, and the channel that has the highest resolution data without overflowing is selected as the output. The selected outputs are merged to produce a seamless stream of output data. The resultant output is a stream of data in which the quantization step-size is larger for large signals and four times smaller for small signals. The level of dynamic range thus provided by the present invention eliminates the implementation of traditional AGC to control the level of the analog input signal to keep the peak voltage level of the analog input signal at or near the full-scale value of the input for the A/D converter.

The FIGURE illustrates the apparatus and method of the invention embodied as a novel dual A/D converter circuit 10. As illustrated in the exemplary embodiment of the FIGURE, when sampled with a dual A/D converter circuit 10 of the invention, the input signal is split into two channels, with separate buffers dedicated for each respective channel. Respective buffer amplifiers 12 and 14 amplify the input signal on respective channels with a gain of one and a gain of four, respectively. Each channel is sampled by one of two substantially identical A/D converters 16 and 18. The two channels are sampled simultaneously. If the gain of four channel is valid, then its result is passed through unmodified as the output of the dual A/D converter circuit 10. If the gain of four channel has overflowed, then its result is discarded; rather, the result of the gain of one channel is left shifted two bit positions and used as the output. The left shift effectively adds two bits of precision to the A/D conversion of small signals, while maintaining range capacity for large signals.

Thus, according to the exemplary embodiment illustrated in the FIGURE, the dual A/D converter circuit 10 of the invention includes: a means for eliminating signal offset errors in both of two separate channels; a means for adjusting the gain of the two channels to differ by a substantially exact factor, such as a factor of four; a means for converting an analog signal input to each of the two separate channels to a digital signal at respective sample times that are adjustable to be substantially simultaneous; a means for detecting a channel overflow condition at least in the channel having the higher gain, i e., the smaller signal channel; and a means for merging the two channels on an "on the fly" basis.

Analog Signal Conditioning

The analog input signal is directed to two signal-clamping amplifier channels, a second of the two amplifier channels having a gain that is higher than the gain of the first channel by a predetermined factor. For example, the first amplifier channel has a gain of two, while the second has a gain of eight. Thus, as compared to each other, the first and second circuits differ in gain by a factor of approximately four. Clamping voltage thresholds are set at levels such that the resulting output slightly exceeds the valid range of a respective first and second channel's A/D converter 16, 18. The buffer amplifiers 12, 14 implement the voltage clamping function by comparing the input signal level and clamping the voltage if the threshold is exceeded. Alternatively, clamping diodes (not shown) can be used to clamp the voltage thresholds to achieve the desired resulting output. Each of the first and second channels is then buffered with a unity-gain single-ended to differential-output amplifier (not shown) before being directed to the respective A/D converter 16, 18.

A/D Conversion

The first and second channels are sampled by respective multi-bit high-speed A/D converters 16, 18. For example, the A/D converters 16, 18 are 14-bit high-speed A/D converters. Sample timing for the A/D converters is provided by sample clocks 24 and 26 are derived from a 64 MHz sine wave using respective differential receivers 28 and 30. One of the differential receivers 28, 30 uses a variable threshold voltage to adjust placement of the rising edge trigger in time with respect to the other receiver 30, 28 to assure that both A/D converters 16, 18 sample substantially simultaneously. The adjustable phase offset is selected using, for example, a voltage-output digital-to-analog converter (DAC) 32. During a calibration cycle, this voltage is adjusted using known means until substantially simultaneous sampling between channels is achieved.

Digital Post-Processing

Each A/D converter channel has an inherent DC offset error. Digital post-processing is used to modify raw samples output by the respective A/D converter 16, 18 and eliminate this signal offset error. A digital subtraction circuit 34 and 36 is included for each respective channel so that a fractional offset correction value is subtracted from the raw sample value.

Since the first and second channels differ in gain by a factor of four, a similar modification is made to the offset-corrected raw values so that the ratio between them is also a factor of four. A digital multiplication circuit 38 is included for the small-signal channel so that it is fractionally scaled to match the large-signal channel by a factor of four. The offset correction and gain scaling constants are computed during a periodic calibration cycle.

To select and format the desired output data, a digital multiplexing circuit 40 is included to merge corrected data values from both the first and second channels and present them as a single output stream. A digital comparator circuit 42 determines whether the small-signal channel has overflowed. This overflow signal from the comparator circuit 42 is used to control the multiplexer 40 and select the valid and most precise output values. To merge channels and account for the factor-of-four difference in data values, a left shift function 44 is operated that left shifts the large-signal channel data entering the multiplexer 40 by two bit positions. This left shift of the large-signal channel data effectively matches values from either channel so that the output appears as a continuous output stream. The left shift is implemented by a bus connection in at the multiplexer 40. The large signal data is connected to the higher-order bits of the multiplexer 40, leaving the two lower-order bits unused, i.e., the two lower-order bits are set to zero. The left shift function 44 is thus part of the data path of the large signal data, which eliminates any need for a shift register. However, in an alternative embodiment, the left shift function 44 may be implemented using a register that left shifts the large-signal channel data two bit positions before entering the multiplexer 40.

An optional digital comparator circuit 46 determines whether the large-signal channel has overflowed whereupon the overflow signal can be output. The large-signal channel overflow signal may be useful in down-stream processing for some applications.

While the preferred embodiment of the invention may be advantageously implemented in CMOS, with the exception of resistors and capacitors, those skilled in the art having the benefit of the disclosures of the present invention will appreciate that other semiconductor technologies may be used to implement the invention. For example, the invention may be integrated using application specific integrated circuit (ASIC) technology, gate arrays or other available integrated circuit techniques.

Furthermore, while the preferred embodiment of the invention has been illustrated and described, it will be appreciated that various changes can be made therein without departing from the spirit and scope of the invention.

What is claimed is:

1. A dual channel analog-to-digital converter circuit, comprising:

two separate channels each being coupled to receive a same analog input signal, each of the two channels having a means for converting an analog input signal to a digital signal at respective sample times that are adjustable to be substantially simultaneous;

a means for adjusting gain of both of the two channels to differ by a fixed multiplication factor;

a means for detecting a channel overflow condition in one of the two channels having a higher gain; and a means for selecting one of the two channels.

2. The circuit of claim 1, further comprising a means for eliminating signal offset errors in the two channels.

3. The circuit of claim 2 wherein the means for eliminating signal offset errors further comprises a digital subtraction circuit.

4. The circuit of claim 1 wherein the means for selecting one of the two channels is operable as a function of a result generated by the channel overflow condition detecting means.

5. The circuit of claim 1 wherein the means for selecting one of the two channels is operable to output a result of the channel having lower gain when a channel overflow condition is detected on the channel having higher gain.

6. The circuit of claim 1, further comprising a means for matching a result of the channel having higher gain to a result of the channel having lower gain.

7. The circuit of claim 1 wherein the means for adjusting the gain of the two channels further comprises an amplifier circuit in each of the two channels.

8. The circuit of claim 1, further comprising a means for adjusting placement of a rising edge in a clock circuit portion of one channel in time with respect to a clock circuit portion of another channel.

9. The circuit of claim 1 wherein the channel overflow condition detecting means further comprises a digital comparator circuit.

10. A dual channel analog-to-digital converter circuit, comprising:

two separate channels each being coupled to receive a same analog input signal, each of the two channels having a means for converting an analog input signal to a digital signal at respective sample times that are adjustable to be substantially simultaneous;

a means for adjusting gain of both of the two channels to differ by a fixed multiplication factor;

a means for detecting a channel overflow condition in one of the two channels having a higher gain;

a means for selecting one of the two channels; and a means for merging the two channels comprising a means for adjusting a data bit position of a result of the channel having lower gain to match a result of the channel having higher gain.

11. A dual analog-to-digital converter circuit, comprising:

first and second separate amplifier circuits each structured to receive a same analog input signal, the first amplifier circuit having a first gain and the second amplifier circuit having a second gain that is a fixed multiple of the first gain;

first and second analog-to-digital converters coupled respectively to sample an output of the first and second amplifier circuits and structured to output respective first and second digital signals representative of the analog input signal;

a comparator circuit coupled to the output of the first analog-to-digital converter and structured to detect a data overflow;

a first shift function coupled to the output of the second analog-to-digital converter and structured to left-shift data output by the second analog-to-digital; and a multiplexer circuit coupled receive the output of the first amplifier circuit, an output of the comparator circuit and an output of the shift function, the multiplexer circuit being structured to select between the output of the first amplifier circuit and the output of the shift function as a function of the output of the comparator circuit and to merge the output of the first amplifier circuit and the output of the shift function into a continuous output stream.

12. The circuit of claim 11 wherein the fixed multiple is an even number.

13. The circuit of claim 11 wherein the fixed multiple is approximately four.

14. A dual analog-to-digital converter circuit, comprising:

first and second separate amplifier circuits each structured to receive a same analog input signal, the first amplifier circuit having a first gain and the second amplifier circuit having a second gain that is a fixed multiple of the first gain, first and second analog-to-digital converters coupled respectively to sample an output of the first and second amplifier circuit and structured to output respective first and second digital signals representative of the analog input signal;

a clock circuit coupled to each of the first and second analog-to-digital converters and being structured to trigger the first and second analog-to-digital converters substantially simultaneously;

a comparator circuit/coupled to the output of the first analog-to-digital converter and structured to detect a data/overflow;

a first shift function coupled to the output of the second analog-to-digital converter and structured to left-shift data output by the second analog-to-digital; and a multiplexer circuit coupled receive the output of the first amplifier circuit, an output of the comparator circuit and an output of the shift function, the multiplexer circuit being structured to select between the output of the first amplifier circuit and the output of the shift function as a function of the output of the comparator circuit and to merge the output of the first amplifier circuit and the output of the shift function into a continuous output stream.

15. A dual analog-to-digital converter circuit, comprising:
   first and second amplifier circuits each structured to receive a same analog input signal, the first amplifier circuit having a first gain and the second amplifier circuit having a second gain that is higher than the first gain;
   first and second analog-to-digital converters coupled respectively to sample an output of the first and second amplifier circuits and structured to output respective first and second digital signals representative of the analog input signal;
   a clock circuit coupled to each of the first and second analog-to-digital converters and being structured to trigger the first and second analog-to-digital converters substantially simultaneously, the clock circuit further comprising:
      first and second differential receivers each being structured to receive a same clock signal, one of the first and second differential receivers utilizing a variable threshold voltage to adjust placement of a rising edge in time with respect to another of the first and second differential receivers, and
      first and second sample clocks receiving an output of the respective first and second differential receivers, the first and second sample clocks being structured to output sample timing signals to the first and second analog-to-digital converters, respectively;
   a comparator circuit coupled to the output of the first analog-to-digital converter and structured to detect a data overflow;
   a first shift function coupled to the output of the second analog-to-digital converter and structured to left-shift data output by the second analog-to-digital converter; and
   a multiplexer circuit coupled receive the output of the first amplifier circuit, an output of the comparator circuit and an output of the shift function, the multiplexer circuit being structured to select between the output of the first amplifier circuit and the output of the shift function as a function of the output of the comparator circuit and to merge the output of the first amplifier circuit and the output of the shift function into a continuous output stream.

16. A dual analog-to-digital converter circuit, comprising:
   first and second amplifier circuits each structured to receive a same analog input signal, the first amplifier circuit having a first gain and the second amplifier circuit having a second gain that is higher than the first gain;
   first and second analog-to-digital converters coupled respectively to sample an output of the first and second amplifier circuits and structured to output respective first and second digital signals representative of the analog input signal;
   a comparator circuit coupled to the output of the first analog-to-digital converter and structured to detect a data overflow;
   a first shift function coupled to the output of the second analog-to-digital converter and structured to left-shift data output by the second analog-to-digital;
   a multiplexer circuit coupled receive the output of the first amplifier circuit, an output of the comparator circuit and an output of the shift function, the multiplexer circuit being structured to select between the output of the first amplifier circuit and the output of the shift function as a function of the output of the comparator circuit and to merge the output of the first amplifier circuit and the output of the shift function into a continuous output stream; and
   first and second subtraction circuits coupled respectively between the first and second analog-to-digital converters and the multiplexer circuit, the first and second subtraction circuits being structured to subtract from the result of the respective first and second analog-to-digital converters a fractional offset correction value.

17. The circuit of claim 16, further comprising a multiplication circuit coupled between the second subtraction circuit and the multiplexer circuit, the multiplication circuit being structured to fractionally scale the output of the second analog-to-digital converter by a predetermined factor to match the output of the first analog-to-digital converter.

18. A dual analog-to-digital converter circuit, comprising:
   first and second separate amplifier circuits each structured to receive a same analog input signal, the first amplifier circuit having a first gain and the second amplifier circuit having a second gain that is a fixed multiple of the first gain;
   first and second analog-to-digital converters coupled respectively to sample an output of the first and second amplifier circuits and structured to output respective first and second digital signals representative of the analog input signal;
   a comparator circuit coupled to the output of the first analog-to-digital converter and structured to detect a data overflow;
   a first shift function coupled to the output of the second analog-to-digital converter and structured to left-shift data output by the second analog-to-digital;
   a multiplexer circuit coupled receive the output of the first amplifier circuit, an output of the comparator circuit and an output of the shift function, the multiplexer circuit being structured to select between the output of the first amplifier circuit and the output of the shift function as a function of the output of the comparator circuit and to merge the output of the first amplifier circuit and the output of the shift function into a continuous output stream; and
   a second comparator circuit coupled to the output of the second analog-to-digital converter and structured to detect a data overflow and output an overflow signal comprising the data overflow.

19. An analog-to-digital converter circuit, comprising:
   (a) an input port for receiving an analog input signal,
   (b) a first channel having:
      (i) a first buffer amplifier coupled to the input port and having a first gain,
      (ii) a first analog-to-digital converter receiving an output of the first buffer amplifier, and
      (iii) a shift function receiving a result of the first analog-to-digital converter;
   (c) a second channel having:
      (i) a second buffer amplifier coupled to the input port and having a second gain that is a fixed multiple of the first gain,
      (ii) a second analog-to-digital converter receiving an output of the second buffer amplifier, and
      (iii) a data overflow detection circuit receiving a result of the second analog-to-digital converter; and (d) a multiplexing circuit coupled to receive a result of each respective first and second channels and to receive a result of the overflow detection circuit, the multiplexing circuit being structured to select the result of one of the first and second channels as a function of the result of the overflow detection circuit and to merge the selected results into a continuous output stream.

20. The circuit of claim 19 wherein the second gain is higher than the first gain by a predetermined factor.

21. The circuit of claim 19 wherein the second analog-to-digital converter is substantially identical to the first analog-to-digital converter.

22. The circuit of claim 19 wherein each of the first and second channels further comprises an offset correction circuit coupled between the respective first and second analog-to-digital converters and the multiplexing circuit.

23. The circuit of claim 19 wherein the shift register left-shifts data in the result of the first channel to match the result of the second channel before the result of the first channel is applied to the multiplexing circuit.

24. An analog-to-digital converter circuit, comprising:
(a) an input port for receiving an analog input signal,
(b) a first channel having:
   (i) a first buffer amplifier coupled to the input port and having a first gain,
   (ii) a first analog-to-digital converter receiving an output of the first buffer amplifier, and
   (iii) a shift function receiving a result of the first analog-to-digital converter;
(c) a second channel having:
   (i) a second buffer amplifier coupled to the input port and having a second gain that is a fixed multiple of the first gain,
   (ii) a second analog-to-digital converter receiving an output of the second buffer amplifier, and
   (iii) a data overflow detection circuit receiving a result of the second analog-to-digital converter;
(d) a clock circuit coupled to each of the first and second analog-to-digital converters, the clock circuit being structured to trigger the first and second analog-to-digital converters substantially simultaneously; and
(e) a multiplexing circuit coupled to receive a result of each respective first and second channels and to receive a result of the overflow detection circuit, the multiplexing circuit being structured to select the result of one of the first and second channels as a function of the result of the overflow detection circuit and to merge the selected results into a continuous output stream.

25. An analog-to-digital converter circuit, comprising:
(a) an input port for receiving an analog input signal,
(b) a first channel having:
   (i) a first buffer amplifier coupled to the input port and having a first gain,
   (ii) a first analog-to-digital converter receiving an output of the first buffer amplifier, and
   (iii) a shift function receiving a result of the first analog-to-digital converter;
(c) a second channel having:
   (i) a second buffer amplifier coupled to the input port and having a second gain that is a fixed multiple of the first gain,
   (ii) a second analog-to-digital converter receiving an output of the second buffer amplifier, and
   (iii) a data overflow detection circuit receiving a result of the second analog-to-digital converter;
(d) a multiplexing circuit coupled to receive a result of each respective first and second channels and to receive a result of the overflow detection circuit, the multiplexing circuit being structured to select the result of one of the first and second channels as a function of the result of the overflow detection circuit and to merge the selected results into a continuous output stream; and a multiplying circuit coupled between the second analog-to-digital converter and the multiplexing circuit, the multiplying circuit being structured to scale the result of the second channel to match the result of the first channel.

26. A method for converting an analog signal to a digital signal, the method comprising:
splitting an input analog signal into large and small signal channels;
scaling the input signal on both the large and small signal channels such that the small signal channel has a higher resolution than the large signal channel by amplifying the input signal on the large signal channel with a first gain and amplifying the input signal on the small signal channel with a second gain that is higher than the first gain by a fixed multiplication factor;
sampling the large and small signal channels using separate analog-to-digital converters; and
outputting a result of one of the large and small signal channels as a function of determining whether the small signal channel is valid.

27. The method of claim 26 wherein sampling the large and small signal channels using analog-to-digital converters further comprises sampling the large and small signal channels substantially simultaneously.

28. The method of claim 26 wherein amplifying the input signal on each of the large and small signal channels further comprises buffering the input signal.

29. The method of claim 26, further comprising eliminating signal offset errors in the large and small signal channels.

30. A method for converting an analog signal to a digital signal, the method comprising:
splitting an input analog signal into large and small signal channels;
scaling the input signal on both the large and small signal channels such that the small signal channel has a higher resolution than the large signal channel by amplifying the input signal on the large signal channel with a first gain and amplifying the input signal on the small signal channel with a second gain that is higher than the first gain by a fixed multiplication factor;
sampling the large and small signal channels using separate analog-to-digital converters;
outputting a result of one of the large and small signal channels as a function of determining whether the small signal channel is valid;
merging a result of the large signal channel with a result of the small signal channel into a merged result; and
outputting the merged results.

31. The method of claim 30, further comprising adding precision to the result of the large signal channel.

32. The method of claim 31 wherein adding precision to the result of the large signal channel further comprises left-shifting the result.

* * * * *